(12) United States Patent
Kumagai et al.

(10) Patent No.: US 7,081,370 B2
(45) Date of Patent: Jul. 25, 2006

(54) SILICON SUBSTRATE APPARATUS AND METHOD OF MANUFACTURING THE SILICON SUBSTRATE APPARATUS

(75) Inventors: Munehito Kumagai, Tokyo (JP); Yukihisa Yoshida, Tokyo (JP); Tsukasa Matsuura, Tokyo (JP); Yukihiro Honma, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 9 days.

(21) Appl. No.: 10/492,360

(22) PCT Filed: Sep. 4, 2002

(86) PCT No.: PCT/JP02/08964

§ 371 (c)(1),
(2), (4) Date: Apr. 13, 2004

(87) PCT Pub. No.: WO2004/023644

PCT Pub. Date: Mar. 18, 2004

(65) Prior Publication Data

US 2005/0009226 A1    Jan. 13, 2005

(51) Int. Cl.
*H01L 21/00* (2006.01)
(52) U.S. Cl. .......... 438/69; 257/E39.005; 257/E27.007
(58) Field of Classification Search ................ 438/69; 505/866; 333/99 S; 257/E27.007, E39.005
See application file for complete search history.

(56) References Cited

U.S. PATENT DOCUMENTS

| | | | |
|---|---|---|---|
| 3,970,965 A | 7/1976 | Shapiro et al. | .......... 331/107 S |
| 4,229,828 A | 10/1980 | Baird et al. | ................. 455/326 |
| 5,501,893 A | 3/1996 | Laermer et al. | |
| 5,757,243 A | 5/1998 | Mizuno et al. | .......... 331/107 S |
| 6,169,301 B1 | 1/2001 | Ishikawa et al. | |
| 2003/0035634 A1* | 2/2003 | Shimada et al. | .............. 385/88 |
| 2003/0146187 A1* | 8/2003 | Sasaki | .......................... 216/24 |

(Continued)

FOREIGN PATENT DOCUMENTS

DE    37 37 671    5/1989

(Continued)

OTHER PUBLICATIONS

Crowe, Thomas W. et al., "Inexpensive Receiver Components for Millimeter and Submillimeter Wavelengths", Eighth International Symposium on Space Terahertz Technology, Harvard University, pp. 377-384 (1997).

(Continued)

*Primary Examiner*—Caridad Everhart
(74) *Attorney, Agent, or Firm*—Leydig, Voit & Mayer, Ltd.

(57) ABSTRACT

A first rectangular groove having a rectangular cross section and a second rectangular groove substantially orthogonal to the first rectangular groove and having a rectangular cross section are formed in a first silicon substrate. A third rectangular groove located at a position facing the first rectangular groove and having a rectangular cross section is formed on a second silicon substrate. A device substrate including a frequency conversion device is provided in the second rectangular groove, so that the frequency conversion device is located where the first and second rectangular grooves are orthogonal to each other. Further, the first silicon substrate on which the device substrate is located is bonded to the second silicon substrate, so that the first rectangular groove opposes the third rectangular groove, forming a rectangular waveguide which includes the first rectangular groove and the third rectangular groove, and in which a received high frequency signal propagates and is incident on the frequency conversion device.

15 Claims, 11 Drawing Sheets

U.S. PATENT DOCUMENTS

2004/0091211 A1* 5/2004 Umebayshi et al. .......... 385/49

FOREIGN PATENT DOCUMENTS

| EP | 0 372 951 | 12/1989 |
|---|---|---|
| EP | 0 744 827 | 5/1996 |
| JP | 5-63409 | 3/1993 |
| JP | 6-216653 | 5/1994 |
| JP | 8-111547 | 4/1996 |
| JP | 10-242718 | 9/1998 |
| JP | 11-168172 | 6/1999 |

OTHER PUBLICATIONS

Timbie et al. "Low Noise Interferometry for Microwave Radiometry", Review of Scientific Instruments, Jan. 6, 1998, vol. 59, No. 6, pp. 914-920. New York.

Salez et al. "An Sis Waveguide Heterodyne Receiver For 600GHZ-635GHZ", International Journal OF Infrared Millimeter Waves, Feb. 1, 1994, pp. 349-368, New York.

* cited by examiner

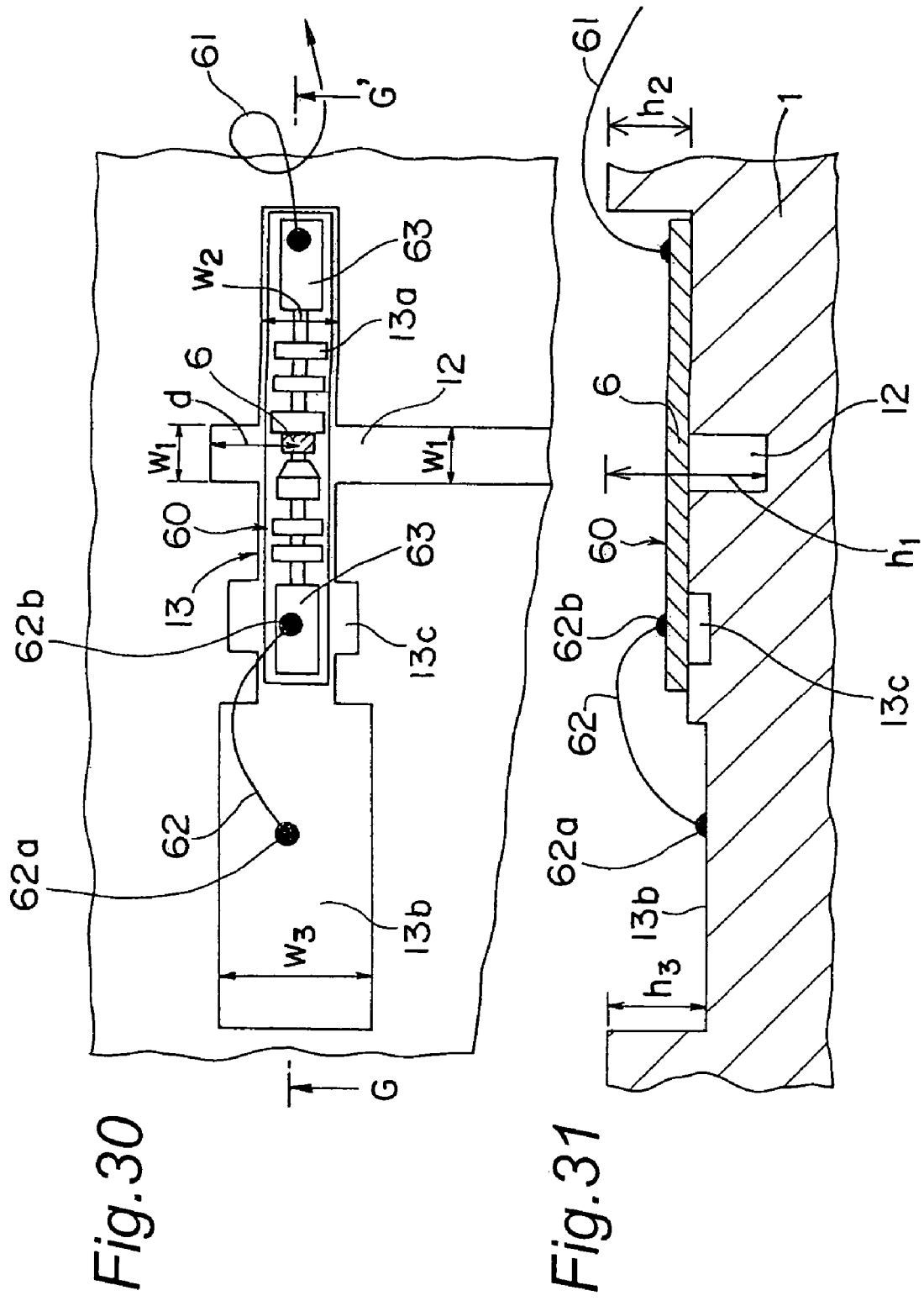

SILICON SUBSTRATE APPARATUS AND METHOD OF MANUFACTURING THE SILICON SUBSTRATE APPARATUS

TECHNICAL FIELD

The present invention relates to a silicon substrate apparatus having a rectangular waveguide formed therein, which is used in a high frequency receiver, and also, to a method of manufacturing a silicon substrate apparatus.

Background Art

In a millimeter waveband or sub-millimeter waveband radio telescope, a heterodyne receiver that employs a waveguide mixer has been conventionally used. An SIS device substrate, having an SIS (Superconductor-Insulator-Superconductor) device including a tunnel junction, having a structure with an electric insulator between a pair of superconductors and conductor patterns connected with the SIS device and constituting a filter circuit , is cooled to 4K and used as a mixer device circuit. As shown in, for example, Japanese patent laid-open publication No. 6-216653 (hereinafter, referred to as the first prior art), an aluminum block is processed by machining, to form a waveguide in which a high frequency received signal and a local oscillation signal propagate, a groove that is orthogonal to the waveguide and that contains the SIS device substrate therein, and a back-short portion having a tuning mechanism. When the high frequency received signal and the local oscillation signal incident on the SIS device on the SIS device substrate, through the waveguide, the SIS device executes frequency conversion processing, down converting a frequency of the signal to a predetermined intermediate frequency to extract a resultant intermediate frequency signal through the filter circuit.

In addition, a prior art document of T. W. Crowe et al., "Inexpensive Receiver Components for Millimeter and Sub Millimeter Wavelengths", Eighth International Symposium on Space Terahertz Technology, pp. 377–384, Harvard University, March 1997 (hereinafter, referred to as a second prior art) describes a method of forming a master block using a semiconductor process or the like and then manufacturing a waveguide in a plastic member by a stamper method, and describes that a photo-resist itself is used as the waveguide.

As described in the first prior art, the waveguide mixer manufactured by the machining method has the following disadvantages. If the frequency used is higher and the mixer is smaller in size, then sufficient, satisfactory position precision for locating the waveguide and the SIS insertion groove to be orthogonal to each other and sufficient, satisfactory processing precision for processing the waveguide, the SIS insertion groove, the back-short portion, and the like cannot be attained.

The second prior art has the following disadvantages. If the waveguide is formed in the plastic member by the stamper method, satisfactory precision for forming the waveguide cannot be attained. If the waveguide is formed with the photo-resist as described in the second prior art, a size and a shape of the waveguide are greatly changed from a predetermined size and a predetermined shape at room temperature, under such a state of a cryogenic temperature of 4K that is an environmental temperature under such a state that the high frequency receiver is used. As a result, the waveguide cannot pursue a waveguide function.

Furthermore, the first prior art and the second prior art have the following disadvantage. If specifications of the frequency with which the waveguide is used are changed, the waveguide cannot be processed promptly with higher precision. As a result, waveguides cannot be mass-produced.

It is an object of the present invention to provide a silicon substrate apparatus and a method of manufacturing the silicon substrate apparatus which can solve these disadvantages, which can be used at a cryogenic temperature that is an environmental temperature under such a state a high frequency receiver is used, and which can mass-produce rectangular waveguides with precision higher than that of the prior art.

DISCLOSURE OF THE INVENTION

According to a first aspect of the present invention, a silicon substrate apparatus is provided which includes a first silicon substrate, a second silicon substrate, and a device substrate. On the first silicon substrate, a first narrow rectangular groove is formed so as to have a rectangular cross section, and a second narrow rectangular groove is formed so as to be substantially orthogonal to the first narrow rectangular groove, and to have a rectangular cross section. On the second silicon substrate, a third narrow rectangular groove is formed at a position facing the first narrow rectangular groove so as to have a rectangular cross section. The device substrate includes a frequency conversion device, and is provided in the second narrow rectangular groove, so that the frequency conversion device is located in a portion in which the first and second narrow rectangular grooves are orthogonal to each other. Further, the first silicon substrate on which the device substrate is provided is bonded onto the second silicon substrate, so that the first narrow rectangular groove opposes to the third narrow rectangular groove to each other, and then, a rectangular waveguide is formed which includes the first narrow rectangular groove and the third narrow rectangular groove. In the rectangular waveguide, a high frequency received signal propagates to be incident onto the frequency conversion device.

In the above-mentioned silicon substrate apparatus, it is preferable that a depth of the first narrow rectangular groove is different from a depth of the second narrow rectangular groove.

It is preferable that the above-mentioned silicon substrate apparatus further includes a groove which is formed in at least one of the first and second silicon substrates at a position in the vicinity of the frequency conversion device. The groove is used for inserting superconducting magnet means for applying a predetermined magnetic field to the frequency conversion device. The superconducting magnet means is provided in the groove for inserting the superconducting magnet means.

In the above-mentioned silicon substrate apparatus, the second narrow rectangular groove is formed, so that a part of the second narrow rectangular groove in which the device substrate is provided has a substantially equal groove width. Alternatively, the second narrow rectangular groove is formed, so that a groove width of each end of the device substrate of the second narrow rectangular groove is substantially equal to a groove width of a part which occupies most of a longitudinal length of a part in which the device substrate is provided.

Further, in the above-mentioned silicon substrate apparatus, the frequency conversion device is an SIS (Superconductor-Insulator-Superconductor) device that is a tunnel junction device having such a structure that an electric insulator is put between a pair of superconductors.

According to a second aspect of the present invention, a method of manufacturing a silicon substrate apparatus is provided which includes the following first, second, third and fourth steps. In the first step, a first narrow rectangular groove is formed on a first silicon substrate so as to have a rectangular cross section, and a second narrow rectangular groove is formed on the first silicon substrate so as to be substantially orthogonal to the first narrow rectangular groove, and to have a rectangular cross section. In the second step, a third narrow rectangular groove is formed on the second silicon substrate at a position facing the first narrow rectangular groove so as to have a rectangular cross section. In the third step, a device substrate is provided which includes a frequency conversion device in the second narrow rectangular groove, so that the frequency conversion device is located in a portion in which the first and second narrow rectangular grooves are orthogonal to each other. In the fourth step, the first silicon substrate on which the device substrate is provided is bonded onto the second silicon substrate, so that the first narrow rectangular groove opposes to the third narrow rectangular groove to each other, and then, a rectangular waveguide is formed which includes the first narrow rectangular groove and the third narrow rectangular groove, in which a high frequency received signal propagates to be incident onto the frequency conversion device.

In the above-mentioned method of manufacturing the silicon substrate apparatus, the first and second steps are executed using a dry etching method for a semiconductor and MEMS (Micro Electro Mechanical Systems) processing. In the first step, it is preferable that the first and second narrow rectangular grooves are formed, so that a depth of the first narrow rectangular groove is different from a depth of the second narrow rectangular groove.

In the above-mentioned method of manufacturing the silicon substrate apparatus, it is preferable that in the first step, when the first and second narrow rectangular grooves are formed in a plurality of stages by the dry etching method, sidewall protection films are formed on sidewalls of the first and second narrow rectangular grooves, respectively. The method further includes a step of removing the respective sidewall protection films after a processing of forming the first and second narrow rectangular grooves by the dry etching method in each of the stages.

Moreover, it is preferable that the above-mentioned method of manufacturing the silicon substrate apparatus further includes a step of forming a groove in at least one of the first and second silicon substrates at a position in the vicinity of the frequency conversion device. In this case, the groove is used for inserting superconducting magnet means for applying a predetermined magnetic field to the frequency conversion device. The method further includes a step of providing the superconducting magnet means in the groove for inserting the superconducting magnet means.

Furthermore, in the above-mentioned method of manufacturing the silicon substrate apparatus, it is preferable that in the first step, the second narrow rectangular groove is formed, so that a part of the second narrow rectangular groove in which the device substrate is provided has a substantially equal groove width. Alternatively, it is preferable that in the first step, the second narrow rectangular groove is formed, so that a groove width of each end of the device substrate of the second narrow rectangular groove is substantially equal to a groove width of a part which occupies most of a longitudinal length of a part in which the device substrate is provided.

Additionally, in the above-mentioned method of manufacturing the silicon substrate apparatus, the frequency conversion device is an SIS (Superconductor-Insulator-Superconductor) device that is a tunnel junction device having such a structure that an electric insulator is put between a pair of superconductors.

According to a third aspect of the present invention, a method of manufacturing a silicon substrate apparatus is provided which includes a step of forming first and second narrow rectangular grooves on a silicon substrate using a dry etching method for a semiconductor and MEMS (Micro Electro Mechanical Machining) processing. The first narrow rectangular groove has a rectangular cross section. The second narrow rectangular groove is substantially orthogonal to the first narrow rectangular groove, has a depth different from a depth of the first narrow rectangular groove, and has a rectangular cross section, In the above-mentioned method of manufacturing the silicon substrate apparatus, it is preferable that in the step, when the first and second narrow rectangular grooves are formed in a plurality of stages by the dry etching method, sidewall protection films are formed on sidewalls of the first and second narrow rectangular grooves, respectively. The method further includes a step of removing the respective sidewall protection films after a processing of forming the first and second narrow rectangular grooves by the dry etching method in each of the stages.

BRIEF DESCRIPTION OF THE DRAWINGS

FIG. 30 is a plan view taken along the line D–D' of FIG. 1 and showing a structure in the vicinity of the SIS device substrate 60 in a second implemental example of the present embodiment.

FIG. 31 is a longitudinal sectional view taken along a line G–G' of FIG. 30.

BEST MODE FOR CARRYING OUT THE INVENTION

Embodiments according to the present invention will be described hereinafter with reference to the drawings.

Figure 1:
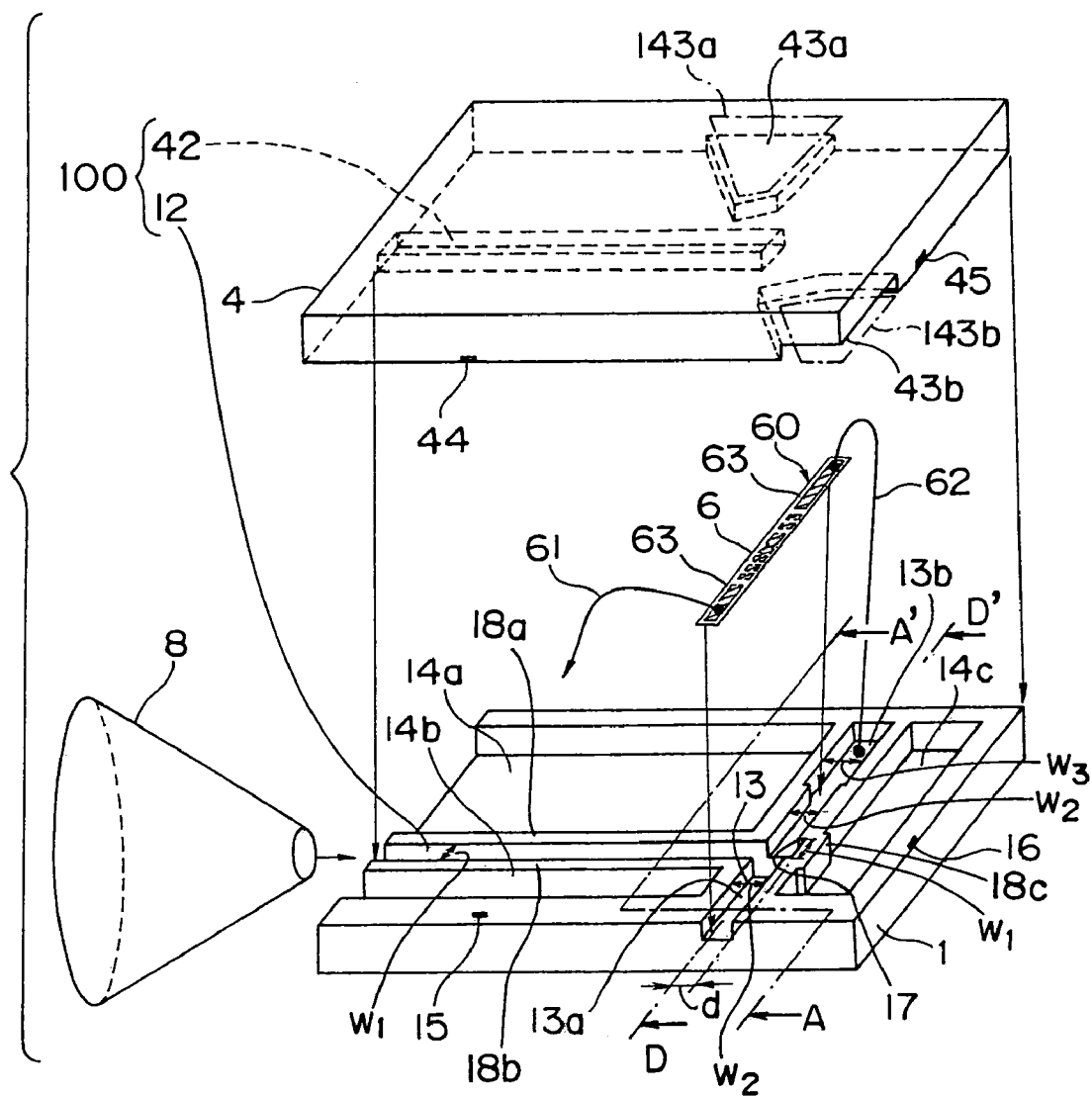
FIG. 1 is an exploded perspective view showing a structure of an SIS mixer device for use in a high frequency radio telescope according to one embodiment of the present invention.

FIG. 1 is an exploded perspective view showing a structure of an SIS mixer device for use in a high frequency radio telescope according to one embodiment of the present invention. This SIS mixer device is disposed in a room cooled to a cryogenic temperature such as 4K or less, receives a radio wave of a frequency band such as 500 GHz band or the like, and converts a frequency of the radio wave. The SIS mixer device is characterized as follows. On an SIS device substrate 60, there are formed an SIS device 6 of a tunnel junction device having such a structure that an electronic insulator is put between a pair of superconductors, and conductor patterns 63 connected with the SIS device 6 to thereby constitute a filter circuit. The SIS device substrate 60 is put between a pair of silicon substrates 1 and 4 processed using a dry etching method related to the semiconductor and MEMS (Micro Electro Mechanical Systems) process method, and then, a pair of silicon substrates 1 and 4 is bonded together. This leads to that a rectangular waveguide 100 is formed which includes a pair of narrow rectangular grooves 12 and 42 of minute width for rectangular waveguide (hereinafter, each referred to as a narrow rectangular groove) and in which a high frequency received signal and a local oscillation signal propagate, and also, there is formed a narrow groove 13 of minute width for inserting an SIS device (hereinafter, referred to as a narrow rectangular groove) so as to be substantially orthogonal to the narrow rectangular grooves 12 and 42. In this case, the narrow groove 13 has a depth smaller than the depth of each of the narrow rectangular grooves 12 and 42, and the narrow groove 13 is used for mounting the SIS device substrate 60 thereon.

On the silicon substrate 1 shown in FIG. 1, the following is formed. The narrow rectangular groove 12 is formed so as to constitute one side of the rectangular waveguide 100 and have a rectangular cross section. The narrow rectangular groove 13 is formed so as to be orthogonal to the narrow rectangular groove 12, to have depths $h_2$ and $h_3$ smaller than a depth $h_1$ of the narrow rectangular groove 12, and to have a rectangular cross section. A back-short portion 17 is formed so as to have a predetermined length. Surrounding concave portions 14a, 14b, and 14c are formed around the grooves and the like. Bonding marks 15 and 16 are formed which are used as reference positions for bonding the silicon substrate 1 onto the silicon substrate 4.

Each of the narrow rectangular groove 12 and the back-short portion 17 has a minute width $w_1$. The narrow rectangular groove 13 includes a first part 13a on which the SIS device substrate 60 is mounted, and a second part 13b grounded by a grounding lead wire 62. The first part 13a has a minute width $w_2$ and the depth $h_2$ ($<h_1$), and the second part 13b has a minute width $w_3$ ($>w_2$) and the depth $h_3$ ($>h_2$). The bonding marks 15 and 16 are formed on side edges of two sides of the silicon substrate 1 which do not oppose to each other, respectively. Silicon wall portions 18a, 18b and 18c each having a width $w_{10}$ are formed between the narrow rectangular groove 12 and the surrounding concave portion 14a, between the narrow rectangular groove 12 and the surrounding concave portion 14b, and the back-short portion 17 and the surrounding concave portion 14c, respectively.

The SIS device 6 is mounted in a substantially central portion of the SIS device substrate 60, and the filter circuit is formed by the conductor patterns 63 between which the SIS device 6 is put. In this case, each of the conductor patterns 63 has a wide conductor pattern and a narrow conductor pattern alternately formed thereon. The SIS device substrate 60 is mounted on the narrow rectangular groove 13, an end portion at the grounding side of the SIS device substrate 60 is connected with the silicon substrate 1 by bonding connection through the grounding lead wire 62 so as to be grounded, and another end portion at signal outputting side of the SIS device substrate 60 is connected with an intermediate frequency signal amplifier (not shown) through a signal leading wire 61. An indium sheet (not shown) is mounted on the SIS device substrate 60, and pressed by the other silicon substrate 4 to be described later when a pair of silicon substrates 1 and 4 is bonded together. In the present embodiment, a length "d" from a center of the SIS device 6 to an end surface of the back-short portion 17 is set to substantially $\lambda g/4$, where $\lambda g$ is a guide wavelength of the high frequency received signal. Then the high frequency received signal propagating on the rectangular waveguide 100 is incident onto the SIS device 6, and also, the high frequency received signal is incident onto the back-short portion 17 after passing through the SIS device 6, reflected by the end surface of the back-short portion 17, and returned again to the SIS device 6 in an optimum state. Namely, it is constituted so that a signal having a substantially maximum amplitude is inputted to the SIS device 6.

On the other silicon substrate 4, the following is formed. A narrow rectangular groove 42 for rectangular waveguide having a rectangular cross section is formed so as to be provided at a position opposing to the narrow rectangular groove 12 of the silicon substrate 1, and so as to form the rectangular waveguide 100 together with the narrow rectangular groove 12 of the silicon substrate 1. Yoke insertion grooves 43a and 43b are formed which are used for inserting superconducting magnet yokes 143a and 143b for applying magnetic fields to the SIS device 6, respectively. Bonding marks 44 and 45 are formed so as to be provided at positions facing the bonding marks 15 and 16 of the silicon substrate 1 and provided on side edges of two sides of the silicon substrate 4 that do not oppose to each other, respectively. Next, on the silicon substrate 1, the SIS device substrate 60 including the SIS device 6 is mounted on the narrow rectangular groove 13 of the silicon substrate 1. The silicon substrate 1 and the silicon substrate 4 are bonded and fixed onto each other by an additive, for example, so that the bonding marks 15 and 16 formed on the silicon substrate 1 coincides with the bonding marks 44 and 45 formed on the silicon substrate 4, respectively. As a result, the narrow rectangular grooves 12 and 42 form the rectangular waveguide 100 which is orthogonal to the narrow rectangular groove 13. Thereafter, a horn antenna 8 is attached to an inlet of the rectangular waveguide 100. The high frequency received signal is received by the horn antenna 8 and incident onto the rectangular waveguide 100. The local oscillation signal is incident onto the rectangular waveguide 100 through another rectangular waveguide (not shown). Further, the superconducting magnet yokes 143a and 143b applying predetermined magnetic fields to the SIS device 6 are inserted into and attached to the yoke insertion grooves 43a and 43b of the silicon substrate 4 in the silicon substrates 1 and 4 thus bonded together, and this leads to formation of the SIS mixer device.

A prototype SIS mixer device as manufactured by the inventors of the present invention has $w_1$=201 μm, $w_2$=201 μm, $w_3$=402 μm, $w_{10}$=170 μm, $h_1$=290 μm, $h_2$=201 μm, $h_3$=250 μm, and $h_4$=290 μm.

In the SIS mixer device thus constituted, the high frequency received signal of the radio wave of a frequency band such as 500 GHz band or the like is received by the horn antenna 8, and then, the same signal passes through and propagates in the rectangular waveguide 100. Further, the same signal is incident onto the SIS device 6 mounted on the SIS device substrate 60, and the high frequency received signal passed through the SIS device 6 is reflected by the end surface of the back-short portion 17 through the back-short portion 17, and then, is returned to the SIS device 6. On the other hand, the local oscillation signal is incident onto the rectangular waveguide 100 through another rectangular waveguide (not shown), and is incident onto the SIS device 6. The SIS device 6 cooled to a the cryogenic temperature of 4K and applied with the predetermined magnetic fields by the superconducting magnet yokes 143a and 143b mixes the incident high frequency received signal with the local oscillation signal, so as to convert the frequency of the high frequency received signal to the predetermined intermediate frequency of a frequency band such as 2 GHz band or the like, thereby generating the predetermined intermediate frequency signal, and outputting the generated intermediate frequency signal to an external reception circuit through the signal leading wire 61.

FIG. 2 to FIG. 11 are longitudinal sectional views taken along a line A–A' of the silicon substrate 1 shown in FIG. 1 and showing first to tenth processing steps using the semiconductor and MEMS processing, respectively. A method of manufacturing the silicon substrate 1 will be now described with reference to FIGS. 2 to 11. In FIGS. 2 to 11, a top surface of the silicon substrate 1 will be referred to as a front surface and a bottom surface of the silicon substrate 1 will be referred to as a rear surface.

Figure 2:
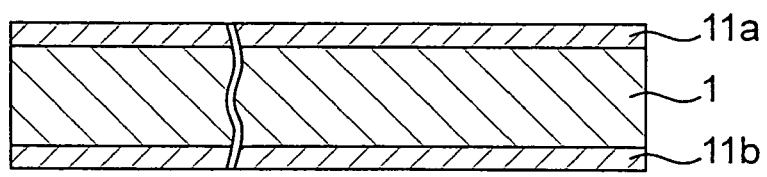
FIG. 2 is a longitudinal sectional view taken along a line A–A' of a silicon substrate 1 shown in FIG. 1 and showing a first processing step using a semiconductor and MEMS processing.
Figure 3:
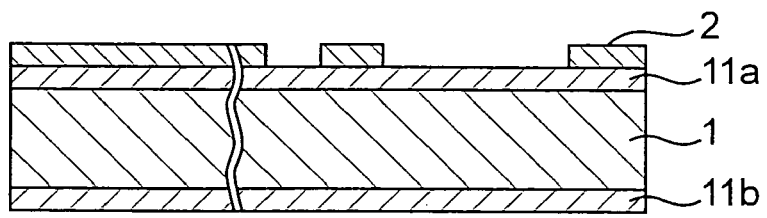
FIG. 3 is a longitudinal sectional view taken along the line A–A' of the silicon substrate 1 shown in FIG. 1 and showing a second processing step using the semiconductor and MEMS processing.
Figure 4:
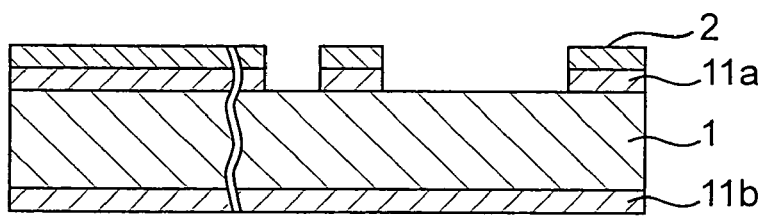
FIG. 4 is a longitudinal sectional view taken along the line A–A' of the silicon substrate 1 shown in FIG. 1 and showing a third processing step using the semiconductor and MEMS processing.
Figure 5:
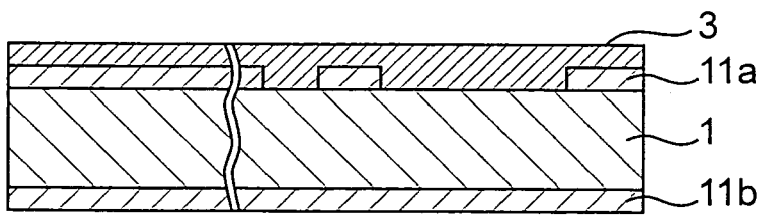
FIG. 5 is a longitudinal sectional view taken along the line A–A' of the silicon substrate 1 shown in FIG. 1 and showing a fourth processing step using the semiconductor and MEMS processing.
Figure 6:
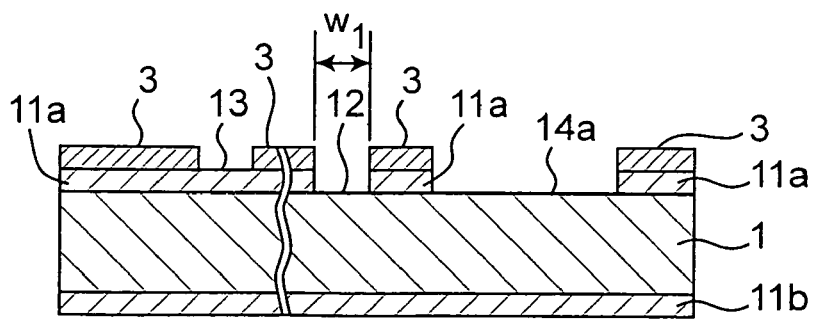
FIG. 6 is a longitudinal sectional view taken along the line A–A' of the silicon substrate 1 shown in FIG. 1 and showing a fifth processing step using the semiconductor and MEMS processing.

First of all, as shown in FIG. 2, the silicon substrate 1 having a thickness of 600 μm is prepared which has thermal oxide films 11a and 11b each of a thickness of 1.5 μm formed on the front and rear surfaces, respectively. Then as shown in FIG. 3, on the front surface of the silicon substrate 1, a resist mask 2 is formed which has a predetermined mask pattern for forming the narrow rectangular groove 12 having the large depth $h_1$, and the grooves 14a, 14b, and 14c having depths slightly larger than the depth $h_1$ by a micro loading effect to be described later. In addition, as shown in FIG. 4, using the resist mask 2, the thermal oxide film 11a of the thickness of 1.5 µm is etched away by a reactive ion etching method using electron cyclotron resonance which is one of dry etching methods (hereinafter, referred to as an ECR-RIE method). As shown in FIG. 5, the resist mask 2 used in the steps of FIG. 4 is removed, and a resist 3 is coated on the entire front surface of the silicon substrate 1 on which the thermal oxide film 11a is formed. Further, as shown in FIG. 6, the resist 3 formed in the steps of FIG. 5 is photoengraved so as to form the following:

(i) There are formed the narrow rectangular groove 12 having a width of 201 µm, and the surrounding concave portions 14a, 14b, and 14c formed to be away from the narrow rectangular groove 12 and the back-short portion 17 by a distance of λg/4, from both of which the thermal oxide film 11a and the resist 3 are removed.

(ii) There are formed parts, where there are formed the narrow rectangular groove 13 from which the resist 3 is removed, and the bonding marks 15 and 16.

(iii) An etching resist mask 3 for leaving the other parts on which the thermal oxide film 11a and the resist 3 are present.

Figure 7:
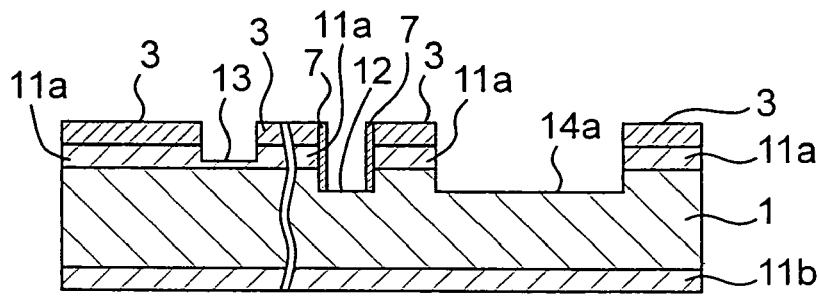
FIG. 7 is a longitudinal sectional view taken along the line A–A' of the silicon substrate 1 shown in FIG. 1 and showing a sixth processing step using the semiconductor and MEMS processing.
Figure 8:
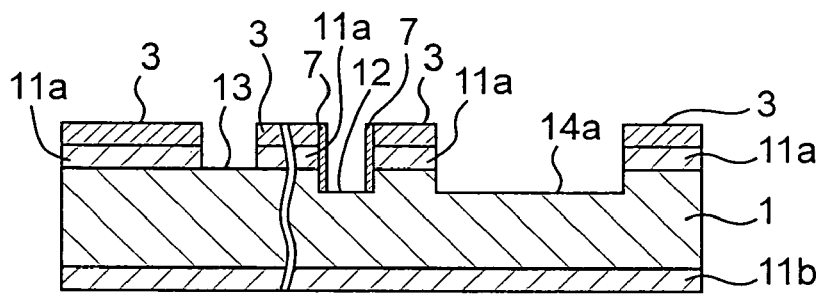
FIG. 8 is a longitudinal sectional view taken along the line A–A' of the silicon substrate 1 shown in FIG. 1 and showing a seventh processing step using the semiconductor and MEMS processing.
Figure 9:
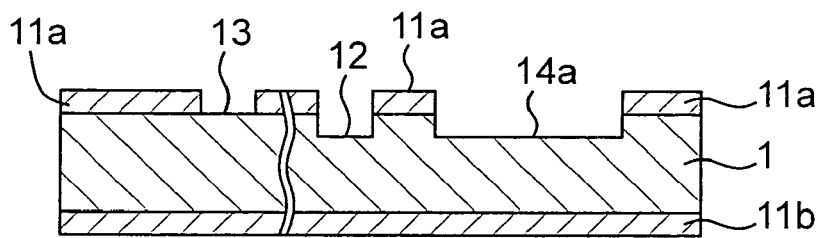
FIG. 9 is a longitudinal sectional view taken along the line A–A' of the silicon substrate 1 shown in FIG. 1 and showing an eighth processing step using the semiconductor and MEMS processing.
Figure 10:
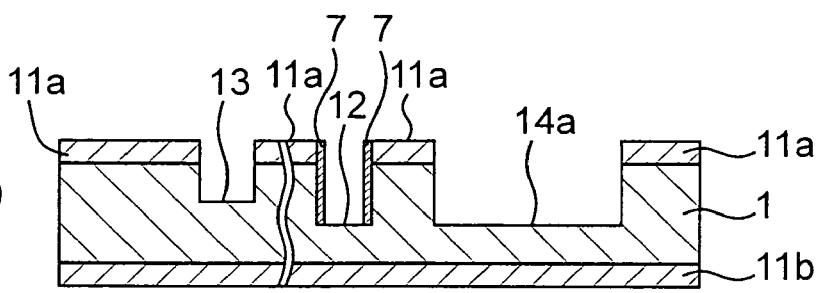
FIG. 10 is a longitudinal sectional view taken along the line A–A' of the silicon substrate 1 shown in FIG. 1 and showing a ninth processing step using the semiconductor and MEMS processing.

Next, as shown in FIG. 7, as a first-stage dry etching processing, by using the resist mask 3 formed in FIG. 6, the silicon substrate 1 is subjected to deep etching from its front surface by 89 µm using a reactive ion etching method using an inductively coupled plasma as an active source and alternately performing etching and sidewall protection in a short period of time, which is one of the dry etching methods related to the semiconductor and MEMS processing (hereinafter, referred to as an ICP-RIE method), and this leads to that a sidewall protection film 7 is formed on each of the grooves including the narrow rectangular groove 12. In FIGS. 7, 8, and 10, the sidewall protection films 7 on the grooves other than the narrow rectangular groove 12 are not shown. As shown in FIG. 8, parts of the thermal oxide film 11a which is to serve as the narrow rectangular groove 13 and the bonding marks 15 and 16 are removed by the ECR-RIE method. Further, as shown in FIG. 9, the resist mask 3 is removed, and the sidewall protection films 7 formed during the etching in the steps of FIG. 7 are removed by a dipping treatment using a liquid mixture of a sulfuric acid and a hydrogen peroxide at 120° C.

Next, as shown in FIG. 10, as a second-stage etching processing, the silicon substrate 1 is subjected to deep etching again from its front surface by 201 µm by the ICP-RIE method while using the thermal oxide film 11a as a mask pattern, and this leads that the sidewall protection film 7 is formed on each of the grooves including the narrow rectangular groove 12. At this moment, the narrow rectangular grooves 12 and 13 having the minute widths different from each other are formed in the surface of the silicon substrate 1, and further, the bonding marks 15 and 16 are formed as shown in FIG. 1. In this case, as shown in FIG. 1, the narrow rectangular groove 12 is formed on one side of the rectangular waveguide 100 so as to be orthogonal to the narrow rectangular groove 13, and to have the depth of 290 µm and the width of 201 µm. Further, the narrow rectangular groove 13 includes the first part 13a having the depth of 201 µm and the width of 201 µm and the second part 13b having the depth of 250 µm and the width of 402 µm. Further, as shown in FIG. 1, the silicon wall portions 18a, 18b, and 18c each having a width $w_{10}$ of λg/4 are formed between the narrow rectangular groove 12 and the surrounding concave portion 14a, between the narrow rectangular groove 12 and the surrounding concave portion 14b, and the back-short portion 17 and the surrounding concave portion 14c, respectively. The surfaces at the sides of the surrounding concave portions 14a, 14b, and 14c of the respective silicon wall portions 18a, 18b, and 18c become open surfaces when viewed in an electric equivalent circuit. In addition, the back-short portion 17 is formed on the right end of the narrow rectangular groove 12 in a portion located left of the silicon wall portion 18c formed in a boundary with the surrounding concave portion 14c. This back-short portion 17 is formed, so that a length thereof (in a longitudinal direction of the narrow rectangular groove 12), i.e., a length from a center of the SIS device 6 mounted later to the end portion of the back-short portion 17 on the right end of the narrow rectangular groove 12 is set to substantially λg/4.

Figure 11:
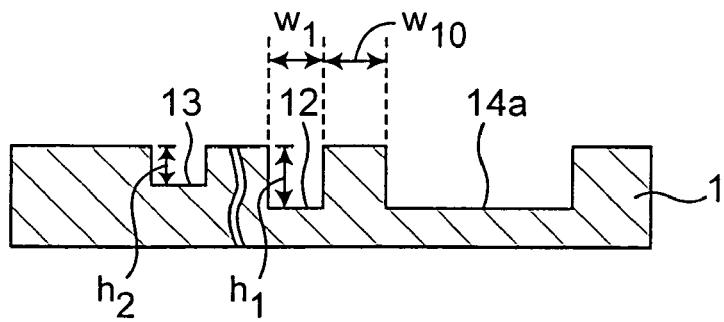
FIG. 11 is a longitudinal sectional view taken along the line A–A' of the silicon substrate 1 shown in FIG. 1 and showing a tenth processing step using the semiconductor and MEMS processing.

Finally, as shown in FIG. 11, there are removed the thermal oxide films 11a and 11b formed on the both surfaces of the silicon substrate 1, respectively, and the sidewall protection films 7 formed during the etching in the steps of FIG. 10 using the second-stage ICP-RIE etching. After the steps up to the steps of FIG. 11 are finished, an anti-fouling film (not shown) is formed on the silicon substrate 4, the silicon substrate 4 is cut to have a predetermined shape, the anti-fouling film is removed, the front, rear and side surfaces of the silicon substrate 1 are entirely coated with gold, and then, the silicon substrate 1 is completed. The steps of FIG. 11 may be executed after cutting the silicon substrate 1.

Figure 12:
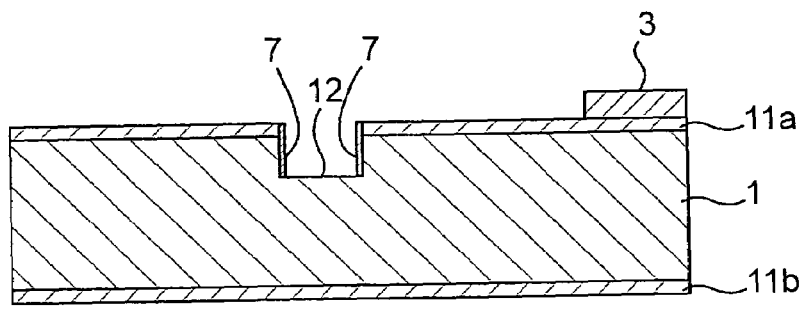
FIG. 12 is a longitudinal sectional view taken along a line D–D' of the silicon substrate 1 shown in FIG. 1 and showing a first processing step using the semiconductor and MEMS processing in a comparison embodiment.
Figure 13:
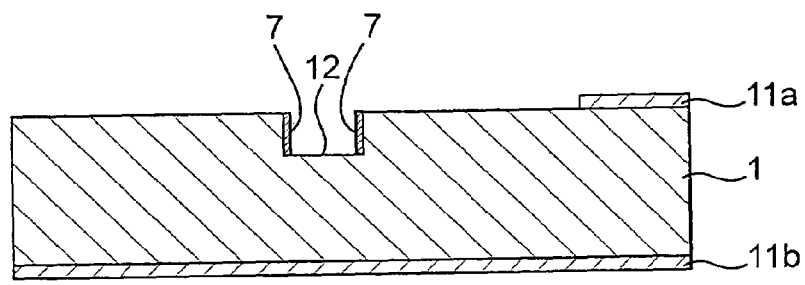
FIG. 13 is a longitudinal sectional view taken along the line D–D' of the silicon substrate 1 shown in FIG. 1 and showing a second processing step using the semiconductor and MEMS processing in the comparative example.
Figure 14:
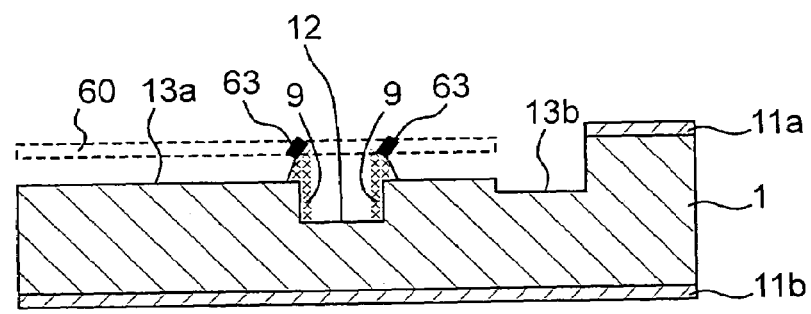
FIG. 14 is a longitudinal sectional view taken along the line D–D' of the silicon substrate 1 shown in FIG. 1 and showing a third processing step using the semiconductor and MEMS processing in the comparative example.
Figure 15:
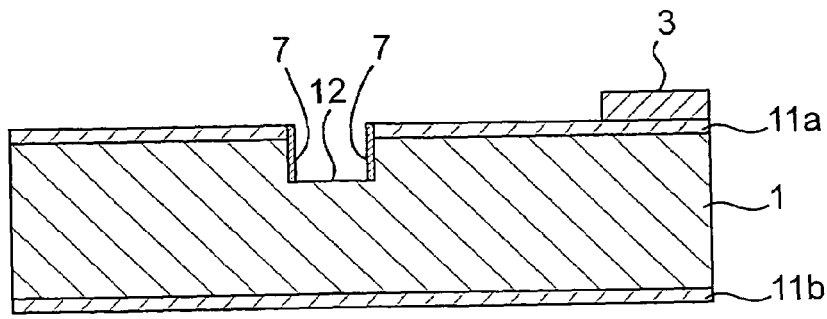
FIG. 15 is a longitudinal sectional view taken along the line D–D' of the silicon substrate 1 shown in FIG. 1 and showing a first processing step using the semiconductor and MEMS processing according to the present embodiment.
Figure 16:
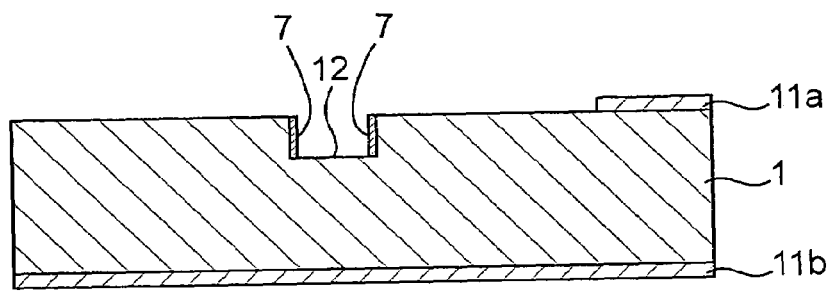
FIG. 16 is a longitudinal sectional view taken along the line D–D' of the silicon substrate 1 shown in FIG. 1 and showing a second processing step using the semiconductor and MEMS processing according to the present embodiment.
Figure 17:
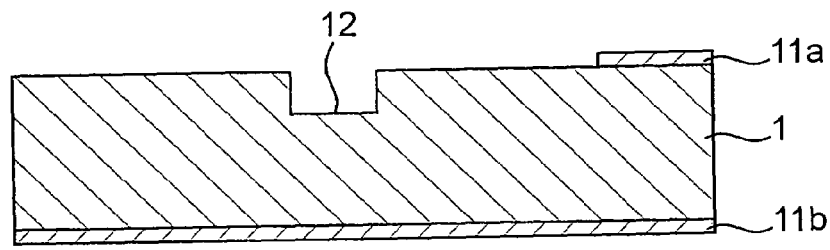
FIG. 17 is a longitudinal sectional view taken along the line D–D' of the silicon substrate 1 shown in FIG. 1 and showing a third processing step using the semiconductor and MEMS processing according to the present embodiment.

The silicon substrate 1 has the narrow rectangular grooves 12 and 13 having depths different from each other, respectively, which are orthogonal to each other and formed in the surface of the silicon substrate 1. The formation of the narrow rectangular grooves 12 and 13 orthogonal to each other and having different depths of the present embodiment will be further described in comparison with a comparative example. FIGS. 12 to 14 are longitudinal sectional views which are taken along a line D–D' of the silicon substrate 1 shown in FIG. 1 and which illustrate first to third processing steps using the semiconductor and MEMS processing in the comparative example.

Meanwhile, the deep etching of the silicon substrate 1 is performed by using the ICP-RIE method that is reactive ion etching technique for alternately performing etching and sidewall protection in a short period of time. FIGS. 12 to 14 illustrate an instance in which silicon substrate 1 is etched simply to have multiple stages and to form minute width grooves having different depths and orthogonal to each other. In the processing using the ICP-RIE method, the sidewall protection films 7 and the silicon of the silicon substrate 1 are different from each other in etching rate by several tens of times, i.e., the etching rate for the sidewall protection films 7 is lower than that for the silicon of the silicon substrate 1. As shown in FIG. 12, if the second-stage etching processing shown in FIG. 14 is performed after the step of removing the resist 3 shown in FIG. 13 while the sidewall protection films 7 formed in the step of first-stage deep etching are left in an intersection between the narrow rectangular grooves 12 and 13, projecting silicon residues 9 are present in the intersection between the narrow rectangular grooves 12 and 13 due to the above-mentioned difference in the etching rate. If the SIS device 6 is mounted on the narrow rectangular groove 13 in this state, defects of broken or damaged parts 63 occur to the SIS device substrate 60 on which the SIS device 6 is mounted because of the presence of convex portions generated by the projecting silicon residues 9.

Figure 18:
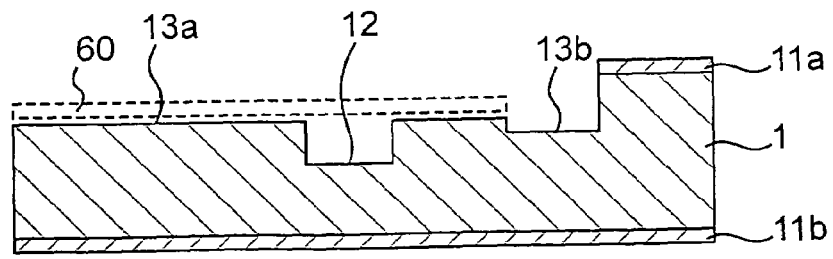
FIG. 18 is a longitudinal sectional view taken along the line D–D' of the silicon substrate 1 shown in FIG. 1 and showing a fourth processing step using the semiconductor and MEMS processing according to the present embodiment.

In order to solve the disadvantages of the comparative example, a processing according to the present embodiment is performed. FIGS. 15 to 18 illustrate longitudinal sectional views which are taken along the line D–D' of the silicon substrate 1 shown in FIG. 1 and which illustrate first to fourth processing steps using the semiconductor and MEMS processing. In other words, in the present embodiment shown in FIGS. 15 to 18, a step of removing the sidewall protection films 7 formed on groove sidewalls during silicon etching using the ICP-RIE method is added between the steps of FIG. 13 and the steps of FIG. 14 in the comparative example (that is, between the steps of FIG. 16 and the steps of FIG. 18 in the present embodiment). Therefore, as shown in FIG. 18, even if the step of second-stage deep etching to the silicon substrate 1 is executed, no projecting silicon residues 9 are generated in the intersection between the narrow rectangular groove 12 for rectangular waveguide and the narrow rectangular groove 13 for inserting the SIS device. In addition, even if the SIS device substrate 60 on which the SIS device 6 is mounted is packaged, no defects such as breaks, damages or the like occur.

In an experiment made by the inventors of the present invention, the dipping treatment for dipping the silicon substrate 1 in the liquid mixture of the sulfuric acid and the hydrogen peroxide at 120° C. for five minutes is performed to remove the sidewall protection films 7. Alternatively, the other method of removing the sidewall protection films 7 that does not damage the silicon substrate 1, e.g., a removal treatment by the dry process using $O_2$ plasma, may be conducted. Further, if the processing of the second-stage deep etching to the silicon substrate 1 should be performed for quite a long time, it is more preferable to add the step of removing the sidewall protection films 7 halfway along the etching.

By providing the step of removing the sidewall protection films 7 formed during the previous-stage etching between the etching stages when the narrow rectangular grooves 12 and 13 having different depths and intersecting each other by the multiple-stage dry etching method, it is advantageously possible to eliminate defects caused by the projecting silicon residues 9 generated due to the difference in etching rate between the sidewall protection films 7 formed during the previous-stage etching and the silicon substrate 1 in the portion in which the narrow rectangular grooves 12 and 13 intersect each other.

Figure 19:
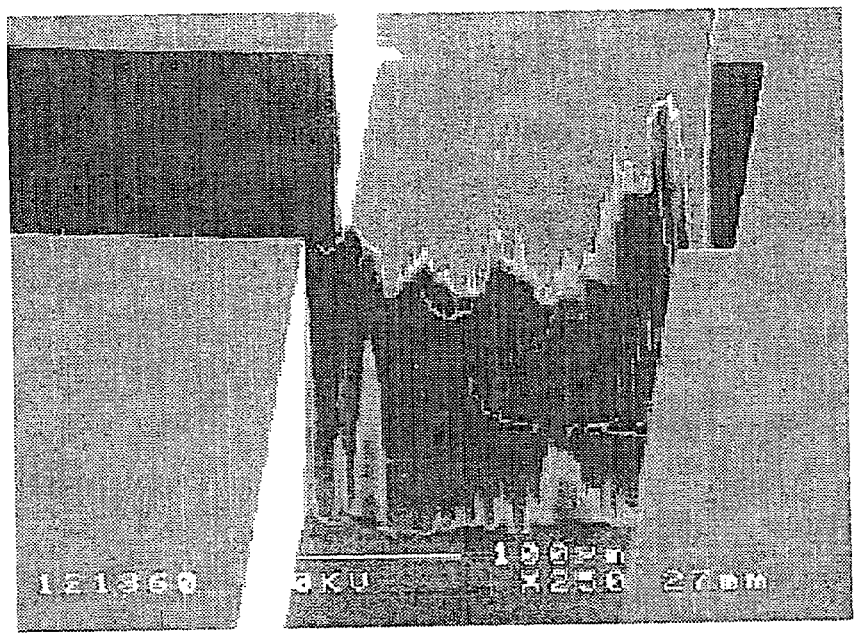
FIG. 19 shows a scanning electron microscope photograph showing an intersection between a narrow rectangular groove 12 of minute width for rectangular waveguide and a first part 13a of a narrow rectangular groove 13 for inserting an SIS device substrate, which are shown in FIG. 1, when the processing steps of the comparative example shown in FIGS. 12 to 14 are employed.
Figure 20:
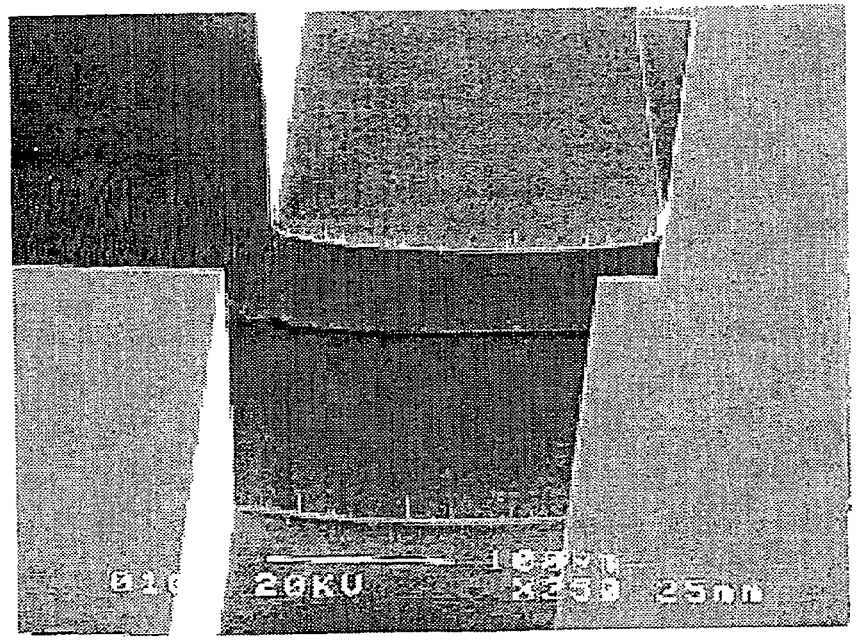
FIG. 20 shows a scanning electron microscope photograph showing an intersection between the narrow rectangular groove 12 for rectangular waveguide and the first part 13a of the narrow rectangular groove 13 for inserting the SIS device substrate, which are shown in FIG. 1, when the processing steps of the embodiment shown in FIGS. 15 to 18 are employed.

FIG. 19 shows a scanning electron microscope photograph which shows the intersection between the narrow rectangular groove 12 for rectangular waveguide and the first part 13a of the SIS device substrate insertion narrow rectangular groove 13 of FIG. 1 when the processing steps of the comparative example shown in FIGS. 12 to 14 are employed. FIG. 20 shows a scanning electron microscope photograph which shows the intersection between the narrow rectangular groove 12 for rectangular waveguide and the first part 13a of the narrow rectangular groove 13 for inserting the SIS device substrate, which are shown in FIG. 1, when the processing steps of the embodiment shown in FIGS. 15 to 18 are employed. As is apparent from FIG. 19 showing a comparative example, projecting silicon residues 9 are present in large quantities at the intersection. As is apparent from FIG. 20 showing an embodiment, by contrast, the projecting silicon resides 9 are hardly present at the intersection but narrow rectangular grooves 12 and 13 of fine minute width are formed.

Figure 21:
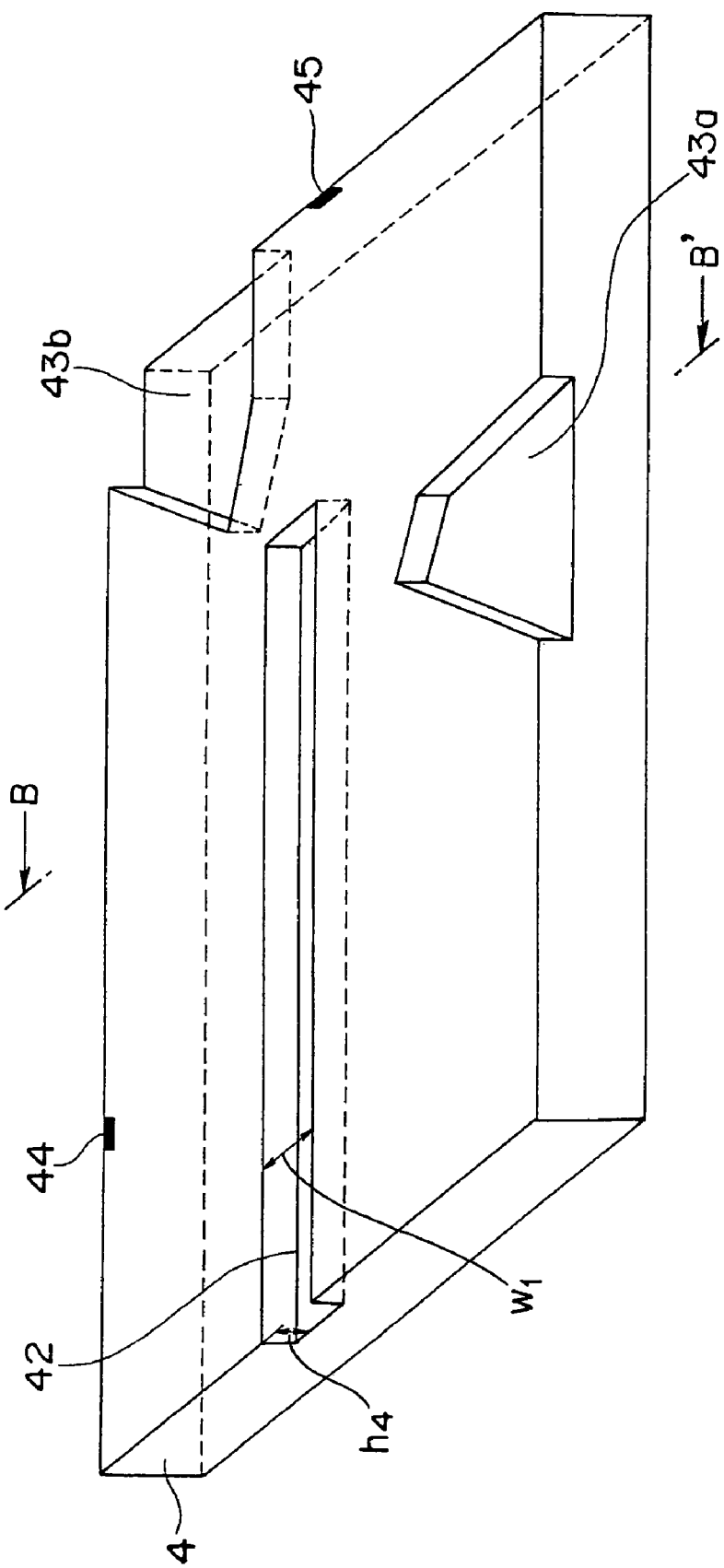
FIG. 21 is a perspective view showing details of a silicon substrate 4 shown in FIG. 1.

FIG. 21 is a perspective view showing details of the silicon substrate 4 shown in FIG. 1. FIGS. 22 to 25 are longitudinal sectional views which are taken along a line B–B' of the silicon substrate 4 shown in FIG. 21 and which illustrate first to fourth processing steps using the semiconductor and MEMS processing. Referring to FIGS. 21 to 25, a method of manufacturing the silicon substrate 4 will be described. FIG. 21 shows that the silicon substrate 4 is turned upside down, so that its top surface becomes a bottom surface and its bottom surface becomes a top surface. In FIGS. 21 to 25, the top surface of the silicon substrate 4 will be referred to as the front surface, and the bottom surface thereof will be referred to as the rear surface.

Figure 22:
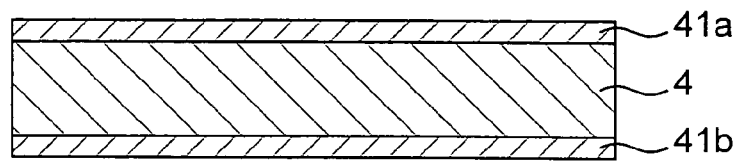
FIG. 22 is a longitudinal sectional view taken along a line B–B' of the silicon substrate 4 shown in FIG. 21 and showing a first processing step using the semiconductor and MEMS processing.
Figure 23:
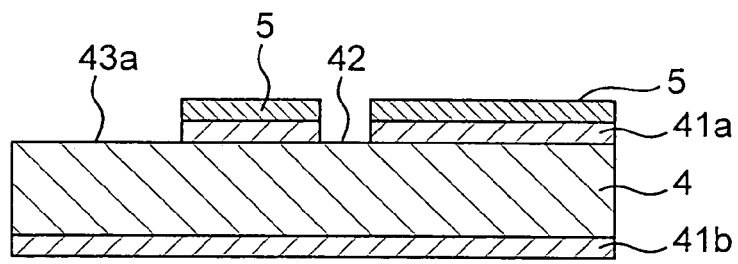
FIG. 23 is a longitudinal sectional view taken along the line B–B' of the silicon substrate 4 shown in FIG. 21 and showing a second processing step using the semiconductor and MEMS processing.
Figure 24:
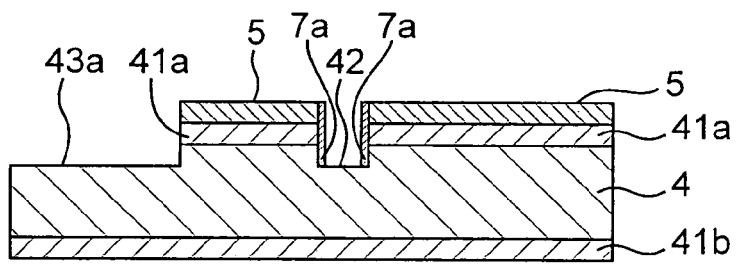
FIG. 24 is a longitudinal sectional view taken along the line B–B' of the silicon substrate 4 shown in FIG. 21 and showing a third processing step using the semiconductor and MEMS processing.

As shown in FIG. 22, there is prepared the silicon substrate 4 having a thermal oxide film 41a of a thickness of 1.5 μm formed on the front surface and a thermal oxide film 41b of a thickness of 1.5 μm formed on the rear surface, and having a thickness of 600 μm. As shown in FIG. 23, on the front surface of the silicon substrate 4, a resist mask 5 is photoengraved, the thermal oxide film 41a is etched by a thickness of 1.5 μm by the ECR-RIE method using this resist mask 5, and a laminate mask including the thermal oxide film 41a and the resist mask 5 is formed. As shown in FIG. 24, using the laminate mask including the thermal oxide film 41a and the resist mask 5 and formed in the steps of FIG. 23, the silicon substrate 4 is subjected to deep etching by 290 μm from its front surface by the ICP-PIE method. This leads to formation of the narrow rectangular groove 42 for rectangular waveguide having a width of 201 μm, the yoke insertion grooves 43a and 43b into which the superconducting magnet yokes for applying magnetic fields to the SIS device 6 are inserted, and the bonding marks 44 and 45. In this case, in the deep etching processing by the ICP-RIE method, sidewall protection films 7a are formed on sidewalls of the respective grooves including the narrow rectangular groove 42. In FIG. 24, the sidewall protection films 7a on the grooves other than the minute width protection groove 42 are not shown. In addition, as shown in FIG. 1, the yoke insertion grooves 43a and 43b are formed at positions near the right end portion of the narrow rectangular groove 42 and in the vicinity of the SIS device when the SIS device substrate 60 is mounted during bonding of the silicon substrate 4 with the silicon substrate 1. As shown in FIG. 1, the bonding marks 44 and 45 are formed at positions at which the marks 44 and 45 opposes to the bonding marks 15 and 16 of the silicon substrate 1, respectively, and on the side edges of the two sides of the silicon substrate 4 which do not oppose to each other. Thereafter, as shown in FIG. 25, there are removed the resist mask 5, the thermal oxide films 41a and 41b, and the sidewall protection films 7a formed during the silicon deep etching by the ICP-RIE method.

Figure 25:
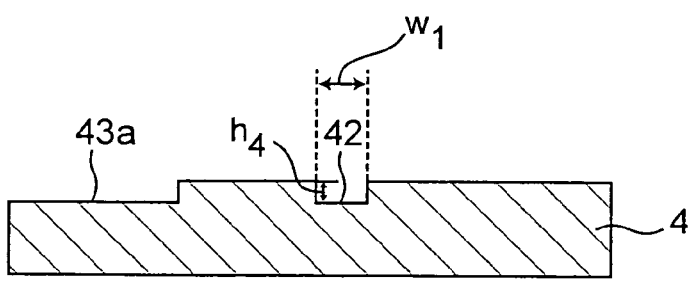
FIG. 25 is a longitudinal sectional view taken along the line B–B' of the silicon substrate 4 shown in FIG. 21 and showing a fourth processing step using the semiconductor and MEMS processing.

After the processing up to the steps of FIG. 25 is finished, a predetermined anti-fouling film (not shown) is formed on the silicon substrate 4, the silicon substrate 4 is cut to have a predetermined shape, and the anti-fouling film is removed. Finally, the front, rear and side surfaces of the silicon substrate 4 are entirely coated with gold, and then, completing the silicon substrate 4. The processing steps of FIG. 25 may be executed after cutting the silicon substrate 4.

In the embodiment as mentioned above, the silicon substrates, on which the thermal oxide films 11a, 11b, 41a and 41b each having a thickness of 1.5 μm are formed on the both surfaces, respectively, are used as the silicon substrates 1 and 4. However, the present invention is not limited to this. The thicknesses of these thermal oxide films 11a, 11b, 41a and 41b are preferably set based on all of the depths of the narrow rectangular grooves of silicon, the etching rate, the thicknesses of the resists, and the like.

In the embodiment as mentioned above, as a block of the SIS mixer device for use in a high frequency radio telescope, a pair of silicon substrates 1 and 4 are used, and the narrow rectangular groove 12 for rectangular waveguide and the narrow rectangular groove 13 for inserting the SIS device, which are different from each other in depth and orthogonal to each other, are integrally formed using the ICP-RIE method based on the semiconductor and MEMS processing, by removing the projecting silicon residues 9 in the portion in which both of the narrow rectangular grooves 12 and 13 intersect each other, bonding the silicon substrate 1 onto the silicon substrate 4, on which the bonding marks 44 and 45 are formed, by adhesive or the like using the bonding marks 15 and 16. This leads to completion of the silicon substrate apparatus for the SIS mixer device. As can be seen, by forming the narrow rectangular grooves 12 and 13 intersecting each other, having different depths, and having substantially perpendicular wall surfaces using the ICP-RIE method which is the dry etching method related to the semiconductor and MEMS processing, formation precision and intersection precision for the narrow rectangular grooves 12 and 13 can be remarkably improved as compared with the machining method.

Furthermore, the narrow rectangular groove 42 having substantially perpendicular wall surfaces, and the bonding marks 44 and 45 are simultaneously formed on the other silicon substrate 4 bonded onto the silicon substrate 1. By bonding the silicon substrate 1 onto the silicon substrate 4, the rectangular waveguide 100 can be constituted in a state in which the narrow rectangular grooves 12 and 42 having rectangular cross sections oppose to each other. In this case, in the narrow rectangular grooves 12 and 42, the wall surfaces of the grooves can be formed to have substantially perpendicular rectangles. Therefore, it is possible to form the rectangular waveguide 100 a cross section of which is substantially rectangular and which exhibits quite a transmission efficiency higher than that of the prior art. In addition, even if the SIS device substrate 60 is mounted on the narrow rectangular groove 13, mounting precision upon mounting the SIS device substrate 60 can be improved as compared with the prior art. Moreover, the paired silicon substrates 1 and 4 can be bonded onto each other, so that the narrow rectangular grooves 12 and 42 accurately oppose to each other at a predetermined position using the bonding marks 15 and 16, and 44 and 45 formed during the formation of the narrow rectangular grooves 12, 13, and 42, and this leads to improvement in the bonding precision. As a result, a progressive wave and a reflected wave can be incident onto the SIS device 6 in a predetermined phase relationship kept therebetween, and the frequency conversion efficiency of the SIS device 6 can be improved as compared with the prior art. Due to this, a reception sensitivity of the SIS mixer device for the high frequency received signal can be improved, and the reliability of the SIS mixer device can be greatly improved accordingly.

Moreover, since the silicon substrates 1 and 4 can be formed by one processing using the dry etching method related to the semiconductor and MEMS processing, the productivity can be greatly improved as compared with the prior art and it is possible to provide the SIS mixer device capable of mass producing the waveguides.

Additionally, the yoke insertion grooves 43a and 43b for inserting the superconducting magnet yokes 143a and 143b for applying the magnetic fields to the SIS device 6 mounted on the SIS device substrate 60 contained in the first part 13a of the narrow rectangular groove 13 of the silicon substrate 1 are formed on the silicon substrate 4. The yoke insertion grooves 43a and 43b are formed at positions quite in the vicinity of the SIS device 6 mounted on the SIS device substrate 60. With this structure, the magnetic fields can be applied to the SIS device 6 from the superconducting magnet yokes 143a and 143b with quite higher efficiency. It is thereby possible to make the superconducting magnets small in size and light in weight as compared with the prior art and to save power consumption.

The advantageous effect of the positions at which the yoke insertion grooves 43a and 43b are arranged will be described concretely with reference to an example. A distance between a tip end of each of the superconducting magnet yokes 143a and 143b and the center of the inserted SIS device 6 is set to 0.6 mm. Therefore, magnetic fields having an intensity of $79.6 \times 10^6$ [A/m] sufficient to suppress the Josephine effect of the SIS device 6 can be applied. According to the prior art, by contrast, the distance is about several millimeters. Compared with the prior art, it is possible to apply quite efficiently necessary magnetic fields to the SIS device 6 and to save power consumption in the present embodiment. Accordingly, it is possible to suppress a variation in the temperature environment of 4K due to heat emission from the superconducting magnets and to make the superconducting magnets small in size. Besides, it is possible to easily handle appropriate intensities of the magnetic fields with small current change against a variation in the necessary intensities of the magnetic fields due to characteristic irregularities of the SIS device 6 or specification change. Besides, a mechanism (not shown) for inputting and outputting permanent magnets and changing the intensities of the magnetic fields is indispensable to the mixer using the permanent magnets as means for obtaining the magnetic fields to suppress the change of the temperature environment of 4K caused by the heat emission from the superconducting magnets so as to apply the intensities of the magnetic fields optimum for the characteristic irregularities of the SIS device 6. With the arrangement according to the present embodiment, it is unnecessary to provide the mechanism, and this leads to that the mixer can be advantageously made smaller in size and lighter in weight and the number of parts can be advantageously decreased.

Furthermore, in FIG. 1, the high frequency received signal incident from the horn antenna 8 passes through and propagates in the rectangular waveguide 100 including the paired narrow rectangular grooves 12 and 42, and then, the same signal is incident onto the SIS device 6 as formed on the SIS device substrate 60, passes through the SIS device 6, and is incident onto the back-short portion 17 provided in the rear portion which is on the right side in FIG. 1. In this case, the back-short portion 17 reflects this high frequency received signal on the end surface at the side of the silicon wall portion 18c of the back short portion 17 to feed the same signal to the SIS device 6 again. Since the distance between the center of the SIS device 6 and the end surface at the side of the silicon wall portion 18c of the back-short portion 17 is set to λg/4, the rectangular waveguide 12 and the back-short portion 17 are constituted, so that the signal having the substantially maximum amplitude of a standing wave formed by the progressive wave and the reflected wave of the high frequency received signal arrives at the SIS device 6, and has an optimum impedance against the high frequency received signal.

On the silicon substrate 1 of the present embodiment, the back-short portion 17 can be formed using the ICP-RIE method related to the semiconductor and MEMS processing with higher processing precision as compared with the prior art and substantially as designed. In addition, a tuning mechanism for optimizing the distance of the back-short portion provided on the rectangular waveguide made of metal is not specially required in a manner different from that of the prior art. As a result, it is unnecessary to assemble the back-short portion including a plurality of members and it is possible to greatly decrease the number of parts of the back-short portion.

A method of forming the narrow rectangular groove 13 for inserting the SIS device in the silicon substrate 1 will be next described in details.

The narrow rectangular groove 13 for inserting the SIS device includes the first part 13a that contains therein the SIS device 60 on which the SIS device 6 is mounted, and the second part 13b having the width $w_3$ larger than the width $w_2$ of the first part 13a so as to attach (handle) the SIS device substrate 60. The ICP-RIE method that is the dry etching method related to the semiconductor and MEMS processing has the micro-loading effect that the etching rate is higher in a part of the mask having a larger opening width as is well known to the art. When the narrow rectangular groove 13 for inserting the SIS device substrate 60 is formed by etching, the second part 13b having the width larger than that of the first part 13a is caved so as to be deeper than the first part 13a, and then, generating a height difference between the first part 13a and the second part 13b. In the implemental example, the depths $h_2$ and $h_3$ of the parts 13a and 13b are 201 μm and 250 μm, respectively.

Figures 26, 27:
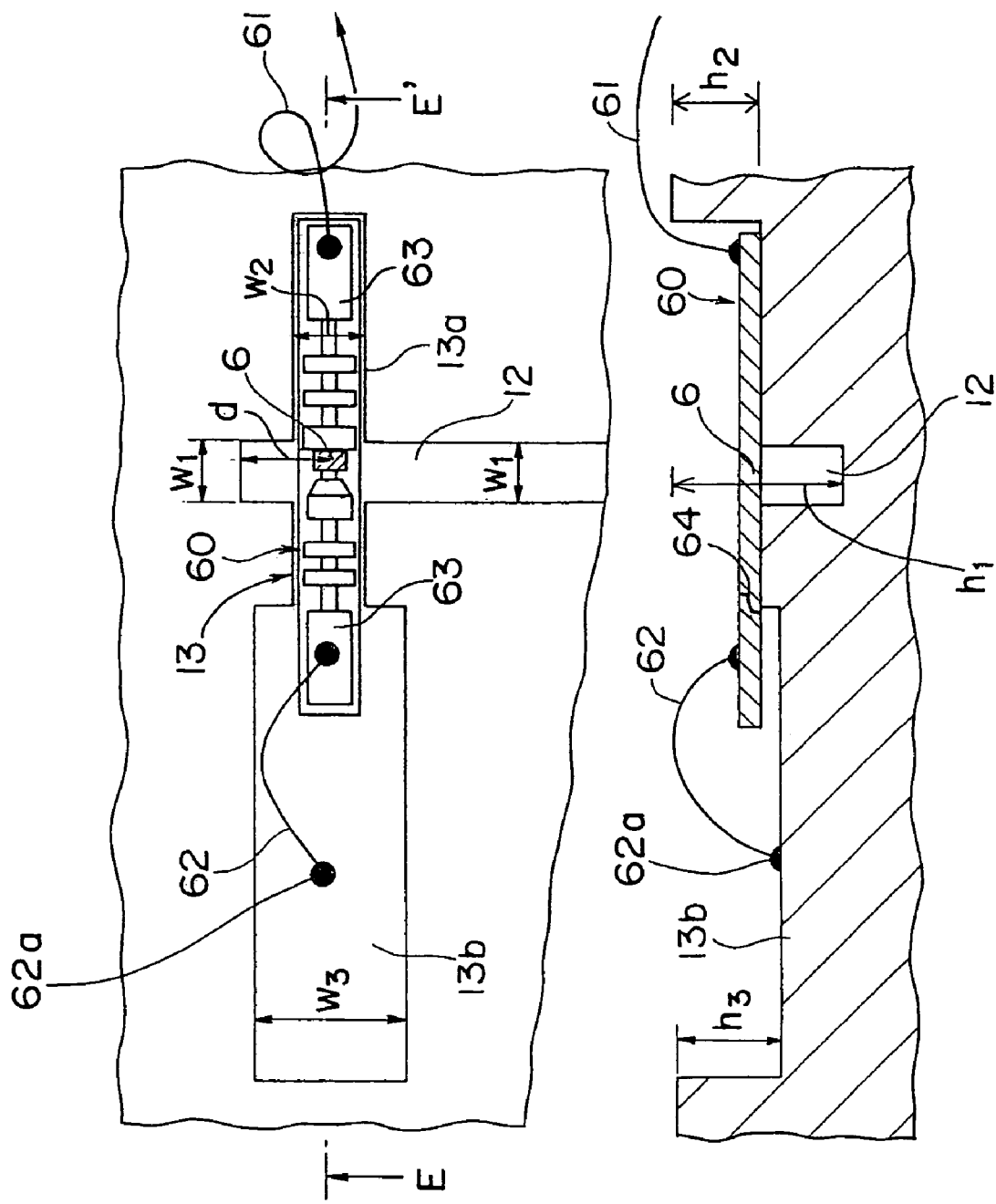
FIG. 26 is a plan view taken along the line D–D' of FIG. 1 and showing a structure of a neighborhood of the SIS device substrate 60 in the comparative example.
FIG. 27 is a longitudinal sectional view taken along a line E–E' of FIG. 26.

FIG. 26 is a plan view taken along the line D–D' of FIG. 1 and showing a structure of a neighborhood of the SIS device substrate 60 in the comparative example. FIG. 27 is a longitudinal sectional view taken along a line E–E' of FIG. 26. Namely, FIGS. 26 and 27 illustrate an instance in which the above-mentioned micro-loading effect is not considered and in which a bonding part 62b at the side of SIS device 6 of the grounding lead wire 62 is located in the part 13b of the narrow rectangular groove for inserting the SIS device. When the grounding lead wire 62 is bonded onto the SIS device substrate 60, the SIS device substrate 60 is in a cantilever state and a break 64 occurs in the SIS device substrate 60.

Figures 28, 29:
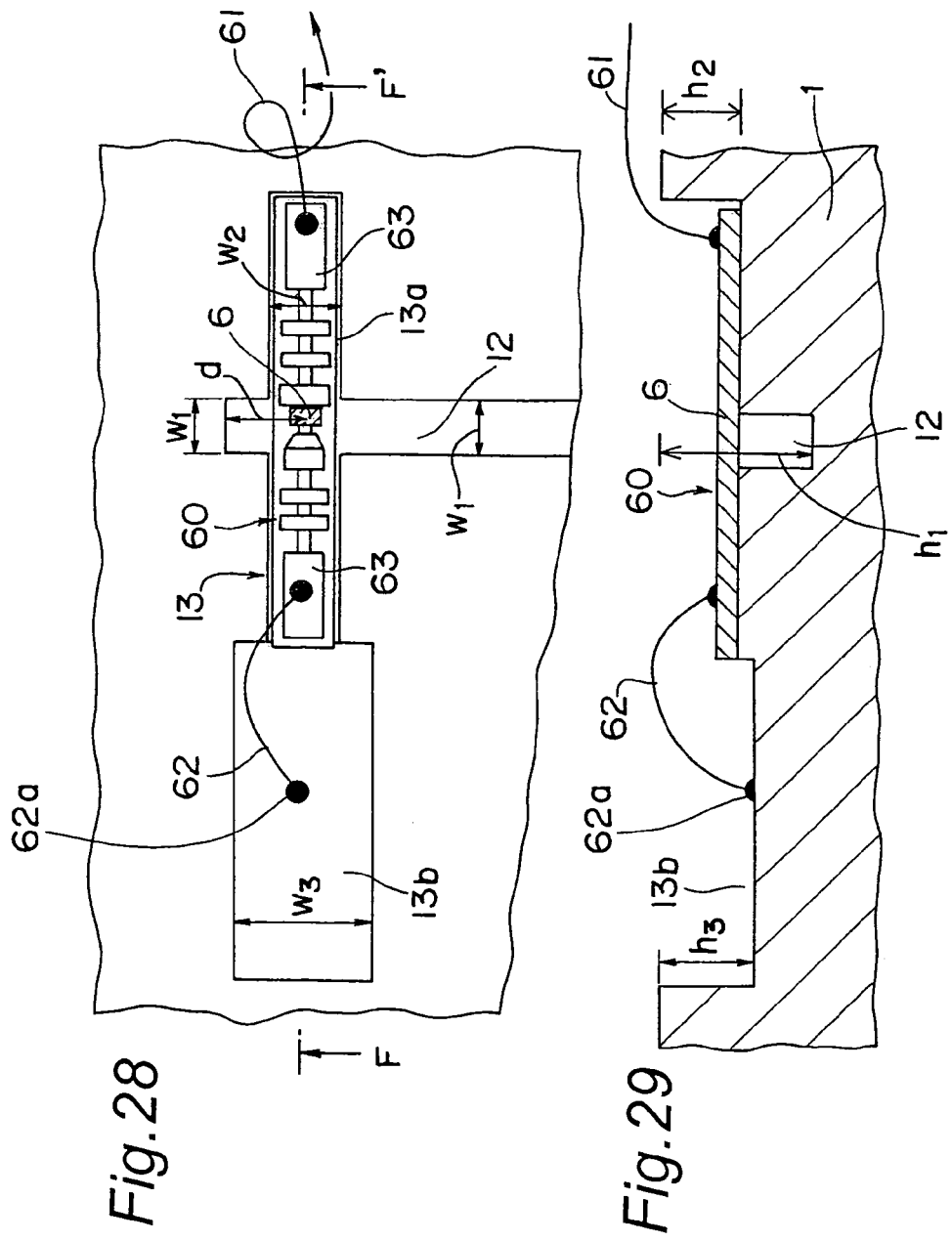
FIG. 28 is a plan view taken along the line D–D' of FIG. 1 and showing a structure in the vicinity of the SIS device substrate 60 in a first implemental example of the present embodiment.
FIG. 29 is a longitudinal sectional view taken along a line F–F' of FIG. 28.

FIG. 28 is a plan view taken along the line D–D' of FIG. 1 and showing a structure in the vicinity of the SIS device substrate 60 in the first implemental example of the present embodiment. FIG. 29 is a longitudinal sectional view taken along a line F–F' of FIG. 28. As shown in FIG. 28, an entire area (an area in the longitudinal direction) of the first part 13a of the narrow rectangular groove 13 that contains therein the SIS device substrate 60 other than the portion in which the narrow rectangular groove 13 intersects the narrow rectangular groove 12 for rectangular waveguide is formed to have the equal width $w_2$. As a result, the entire area of the first part 13a of the narrow rectangular groove 13 other than the portion in which the narrow rectangular groove 13 intersects the narrow rectangular groove 12 for rectangular waveguide has the equal depth $h_2$. Namely, it is possible to eliminate the influence of the micro-loading effect of the narrow rectangular groove 13 during etching of silicon, to prevent the SIS device substrate 60 from turning into the cantilever state shown in FIG. 27 when the SIS device substrate 60 is mounted on a bench portion of the first part 13a, and to eliminate the break occurring during the mounting of the SIS device substrate 60 and wire-bonding, thereby improving the reliability of the apparatus.

FIG. 30 is a plan view taken along the line D–D' of FIG. 1 and showing a structure in the vicinity of the SIS device substrate 60 in the second implemental example of the present embodiment. FIG. 31 is a longitudinal sectional view taken along a line G–G' of FIG. 30. As shown in FIGS. 30 and 31, a tool insertion groove 13c used upon bonding the grounding lead wire 62 is formed substantially in the central portion of the narrow rectangular groove 13 (at a position slightly shifted right from the left end portion of the first part 13a). This tool insertion groove 13c has a width larger than the width $w_2$ of the first part 13a of the narrow rectangular groove 13. The left end portion of the SIS device substrate 60 is mounted on a portion (in the first part 13a) having the same width as that of the width $w_2$ of the first part 13a. In this case, the bonding part 62b at the side of the SIS device substrate 6 of the grounding lead wire 62 is located on the top surface of the SIS device substrate 60 above the tool insertion groove 13c. Accordingly, as shown in FIG. 31, it is possible to prevent the SIS device substrate 60 from turning into the cantilever state when the SIS device substrate 60 is mounted on the bench portion of the first part 13a of the narrow rectangular groove 13, to prevent the break occurring during the mounting of the SIS device substrate 60 and wire-bonding, thereby improving the reliability of the apparatus.

In the first and second implemental examples referring to FIGS. 28 to 31, the structure of the first part 13a of the narrow rectangular groove 13 on the left end portion of the SIS device substrate 60 is described. This structure may be applied to the first part 13a of the narrow rectangular groove 13 on the right end portion of the SIS device substrate 60. That is, it is preferable that the groove width of the first part 13a of the narrow rectangular groove 13 on both end portions of the SIS device substrate 60 is at least set to the groove width $w_2$ of the first part 13a that is the groove width of the part which occupies most of the first part 13a in the longitudinal direction of the first part 13a.

In the embodiment as mentioned above, the yoke insertion grooves 43a and 43b for inserting the superconducting magnet yokes are formed in the silicon substrate 4. However, the present invention is not limited to this. The yoke insertion grooves 43a and 43b for inserting the superconducting magnet may be formed at the positions in the vicinity of the SIS device 6 on the silicon substrate 1. Further, the yoke insertion grooves 43a and 43b for inserting the superconducting magnet yokes may be formed in the silicon substrates 1 and 4, respectively.

INDUSTRIAL APPLICABILITY

As described above in detail, according to the first aspect of the present invention, a silicon substrate apparatus is provided which includes a first silicon substrate, a second silicon substrate, and a device substrate. On the first silicon substrate, a first narrow rectangular groove is formed so as to have a rectangular cross section, and a second narrow rectangular groove is formed so as to be substantially orthogonal to the first narrow rectangular groove, and to have a rectangular cross section. On the second silicon substrate, a third narrow rectangular groove is formed at a position facing the first narrow rectangular groove so as to have a rectangular cross section. The device substrate includes a frequency conversion device, and is provided in the second narrow rectangular groove, so that the frequency conversion device is located in a portion in which the first and second narrow rectangular grooves are orthogonal to each other. Further, the first silicon substrate on which the device substrate is provided is bonded onto the second silicon substrate, so that the first narrow rectangular groove opposes to the third narrow rectangular groove to each other, and then, a rectangular waveguide is formed which includes the first narrow rectangular groove and the third narrow rectangular groove. In the rectangular waveguide, a high frequency received signal propagates to be incident onto the frequency conversion device.

Accordingly, it is possible to provide the silicon substrate apparatus which can be used at a cryogenic temperature that is the temperature of the environment under such a state that the high frequency receiver is used, and which can mass-produce rectangular waveguides with precision higher than that of the prior art. Further, by forming the rectangular waveguide with higher precision, it is possible to greatly improve transmission efficiency upon transmitting the high frequency received signal to the frequency conversion device through the rectangular waveguide, as compared with the prior art. It is thereby possible to improve a reception sensitivity of the SIS mixer device that employs the silicon substrate apparatus for the high frequency received signal and to greatly improve the reliability of the SIS mixer device.

Further, according to the second aspect of the present invention, a method of manufacturing a silicon substrate apparatus is provided which includes the following first, second, third and fourth steps. In the first step, a first narrow rectangular groove is formed on a first silicon substrate so as to have a rectangular cross section, and a second narrow rectangular groove is formed on the first silicon substrate so as to be substantially orthogonal to the first narrow rectangular groove, and to have a rectangular cross section. In the second step, a third narrow rectangular groove is formed on the second silicon substrate at a position facing the first narrow rectangular groove so as to have a rectangular cross section. In the third step, a device substrate is provided which includes a frequency conversion device in the second narrow rectangular groove, so that the frequency conversion device is located in a portion in which the first and second narrow rectangular grooves are orthogonal to each other. In the fourth step, the first silicon substrate on which the device substrate is provided is bonded onto the second silicon substrate, so that the first narrow rectangular groove opposes to the third narrow rectangular groove to each other, and then, a rectangular waveguide is formed which includes the first narrow rectangular groove and the third narrow rectangular groove, in which a high frequency received signal propagates to be incident onto the frequency conversion device.

Accordingly, it is possible to provide the method of manufacturing the silicon substrate apparatus which can be used at a cryogenic temperature that is the temperature of the environment under such a state that the high frequency receiver is used, and which can mass-produce rectangular waveguides with precision higher than that of the prior art. Further, by forming the rectangular waveguide with higher precision, it is possible to greatly improve transmission efficiency upon transmitting the high frequency received signal to the frequency conversion device through the rectangular waveguide, as compared with the prior art. It is thereby possible to improve a reception sensitivity of the SIS mixer device that employs the silicon substrate apparatus for the high frequency received signal and to greatly improve the reliability of the SIS mixer device.

Moreover, according to the third aspect of the present invention, a method of manufacturing a silicon substrate apparatus is provided which includes a step of forming first and second narrow rectangular grooves on a silicon substrate using a dry etching method for a semiconductor and MEMS (Micro Electro Mechanical Machining) processing. The first narrow rectangular groove has a rectangular cross section. The second narrow rectangular groove is substantially orthogonal to the first narrow rectangular groove, has a depth different from a depth of the first narrow rectangular groove, and has a rectangular cross section, Accordingly, by forming the first and second narrow rectangular grooves intersecting each other and having different depths on the silicon substrate by the dry etching method for the semiconductor and MEMS (Micro Electro Mechanical Systems) processing, the first and second narrow rectangular grooves can be formed with precision higher than that of the prior art. Besides, since the silicon substrates can be formed by one processing, the productivity can be greatly improved as compared with the prior art.

In the method of manufacturing the silicon substrate apparatus according to the third aspect of the present invention, it is preferable that in the above-mentioned step, when the first and second narrow rectangular grooves are formed in a plurality of stages by the dry etching method, sidewall protection films are formed on sidewalls of the first and second narrow rectangular grooves, respectively. The method further includes a step of removing the respective sidewall protection films after a processing of forming the first and second narrow rectangular grooves by the dry etching method in each of the stages.

Accordingly, it is possible to eliminate projecting silicon residues at the intersection between the first and second narrow rectangular grooves intersecting each other and having different depths, and to greatly improve the reliability of the silicon substrate as compared with the prior art.

The invention claimed is:

1. A silicon substrate apparatus comprising:
   a first silicon substrate including a first rectangular groove having a rectangular cross section and a second rectangular groove substantially orthogonal to said first rectangular groove and having a rectangular cross section;
   a second silicon substrate including a third rectangular groove located at a position facing said first rectangular groove and having a rectangular cross section; and
   a device substrate including a frequency conversion device, and located in said second rectangular groove, so that said frequency conversion device is located where said first and second rectangular grooves are orthogonal to each other, wherein said first silicon substrate on which said device substrate is located is bonded to said second silicon substrate so that said first rectangular groove opposes said third rectangular groove, forming a rectangular waveguide which includes said first rectangular groove and said third rectangular groove, and in which a received high frequency signal propagates and is incident on said frequency conversion device.

2. The silicon substrate apparatus as claimed in claim 1, wherein said first rectangular groove has a depth different from depth of said second rectangular groove.

3. The silicon substrate apparatus as claimed in claim 1, further comprising:
   superconducting magnet means; and
   a groove in at least one of said first and second silicon substrates at a position proximate said frequency conversion device, said groove receiving said superconducting magnet means for applying a magnetic field to said frequency conversion device.

4. The silicon substrate apparatus as claimed in claim 1, wherein said second rectangular groove has a substantially uniform width where said device substrate is located.

5. The silicon substrate apparatus as claimed in claim 1, wherein said second rectangular groove is formed, so that a groove width of each end of said device substrate of said second rectangular groove is substantially equal to a groove width of a part which occupies most of a longitudinal length of a part in which said device substrate is provided.

6. The silicon substrate apparatus as claimed in claim 1, wherein said frequency conversion device is an SIS (Superconductor-Insulator-Superconductor) device including a tunnel junction device including an electric insulator between a pair of superconductors.

7. A method of manufacturing a silicon substrate apparatus including:
  forming in a first silicon substrate a first rectangular groove having a rectangular cross section, and a second rectangular groove substantially orthogonal to said first rectangular groove and having a rectangular cross section;
  forming in a second silicon substrate a third rectangular groove at a position facing said first rectangular groove and having a rectangular cross section;
  placing a device substrate including a frequency conversion device in said second rectangular groove, so that said frequency conversion device is located where said first and second rectangular grooves are orthogonal to each other; and
  forming a rectangular waveguide, which includes said first rectangular groove and said third rectangular groove and in which a received high frequency signal propagates and is incident on said frequency conversion device, by bonding said first silicon substrate on which said device substrate is located, to said second silicon substrate, so that said first rectangular groove opposes said third rectangular groove.

8. The method of manufacturing the silicon substrate apparatus as claimed in claim 7, further including:
  providing a superconducting magnet means;
  forming a third groove in at least one of said first and second silicon substrates at a position proximate said frequency conversion device, for receiving said superconducting magnet means for applying a magnetic field to said frequency conversion device; and
  inserting said superconducting magnet means into the third groove.

9. The method of manufacturing the silicon substrate apparatus as claimed in claim 7, including forming said second rectangular groove so that a part of said second rectangular groove in which said device substrate is located has a substantially uniform groove width.

10. The method of manufacturing the silicon substrate apparatus as claimed in claim 7, including forming said second rectangular groove so that groove width of each end of said device substrate of said second rectangular groove is substantially equal to groove width of a part which occupies most of a longitudinal length of a part in which said device substrate is located.

11. The method of manufacturing the silicon substrate apparatus as claimed in claim 7, wherein said frequency conversion device is an SIS (Superconductor-Insulator-Superconductor) device including a tunnel junction device having an electric insulator between a pair of superconductors.

12. The method of manufacturing the silicon substrate apparatus as claimed in claim 7, including
  dry etching said first and second silicon substrates to form said first, second, and third rectangular grooves, and
  forming said first and second rectangular grooves so that depth of said first rectangular groove is different from depth of said second rectangular groove.

13. The method of manufacturing the silicon substrate apparatus as claimed in claim 12, including
  forming said first and second rectangular grooves in a plurality of stages of dry etching, each stage of dry etching producing sidewall protection films on sidewalls of said first and second rectangular grooves, respectively, and
  removing said respective sidewall protection films after forming said first and second rectangular grooves by the dry etching, in each of the stages.

14. A method of manufacturing a silicon substrate apparatus including forming by dry etching both a first rectangular groove having a rectangular cross section, and a second rectangular groove which is substantially orthogonal to said first rectangular groove, which has a depth different from a depth of said first rectangular groove, and which has a rectangular cross section, in a silicon substrate.

15. The method of manufacturing the silicon substrate apparatus as claimed in claim 14, including
  forming said first and second rectangular grooves in a plurality of stages of dry etching, each stage of dry etching producing sidewall protection films on sidewalls of said first and second rectangular grooves, respectively, and
  removing said respective sidewall protection films after forming said first and second rectangular grooves by dry etching, in each of the stages.

* * * * *

UNITED STATES PATENT AND TRADEMARK OFFICE
CERTIFICATE OF CORRECTION

| | |
|---|---|
| PATENT NO. | : 7,081,370 B2 |
| APPLICATION NO. | : 10/492360 |
| DATED | : July 25, 2006 |
| INVENTOR(S) | : Kumagai et al. |

It is certified that error appears in the above-identified patent and that said Letters Patent is hereby corrected as shown below:

On Title page item (56) References Cited insert --2003/0210868 A1* 11/2003 Abe et al. ........385/52--

Signed and Sealed this

Twenty-sixth Day of June, 2007

JON W. DUDAS
*Director of the United States Patent and Trademark Office*